United States Patent
Pupalaikis

(10) Patent No.: US 6,819,279 B2
(45) Date of Patent: Nov. 16, 2004

(54) METHOD AND APPARATUS FOR THE RECOVERY OF SIGNALS ACQUIRED BY AN INTERLEAVED SYSTEM OF DIGITIZERS WITH MISMATCHING FREQUENCY RESPONSE CHARACTERISTICS

(75) Inventor: Peter J. Pupalaikis, Ramsey, NJ (US)

(73) Assignee: LeCroy Corporation, Chestnut Ridge, NY (US)

(*) Notice: Subject to any disclaimer, the term of this patent is extended or adjusted under 35 U.S.C. 154(b) by 0 days.

(21) Appl. No.: 10/379,648

(22) Filed: Mar. 5, 2003

(65) Prior Publication Data

US 2004/0174284 A1 Sep. 9, 2004

(51) Int. Cl.[7] .............................. H03M 1/12
(52) U.S. Cl. ...................... 341/155; 341/126
(58) Field of Search .............. 341/155, 126, 341/159, 118, 120, 143

(56) References Cited

U.S. PATENT DOCUMENTS

| 5,239,299 A | | 8/1993 | Apple et al. |
| 5,345,408 A | * | 9/1994 | Hoogenboom ............ 708/402 |
| 5,737,450 A | * | 4/1998 | Hajjahmad et al. ........ 382/260 |
| 5,924,926 A | | 7/1999 | Brown |
| 5,978,742 A | | 11/1999 | Pickerd |
| 6,567,030 B1 | * | 5/2003 | Pupalaikis ................. 341/155 |

* cited by examiner

Primary Examiner—Brian Young
Assistant Examiner—John B Nguyen
(74) Attorney, Agent, or Firm—Frommer Lawrence & Haug LLP; William S. Frommer

(57) ABSTRACT

A method and apparatus of processing waveforms acquired in a waveform digitizing instrument utilizing multiple, interleaved digitizing elements is provided to improve the accuracy of the data acquired is provided. The present method utilizes measured analog-to-digital converter frequency response characteristics to generate sets of coefficients. When data is acquired by a waveform digitizing system, the present method utilizes these coefficients to correct the waveform, thus undoing the adverse effects of the non-ideal frequency response characteristics, resulting in a waveform acquired with higher fidelity. The waveform resulting from this method is a waveform that more closely represents the signal sampled by the digitizing system.

24 Claims, 5 Drawing Sheets

—— Applied Signal

METHOD AND APPARATUS FOR THE RECOVERY OF SIGNALS ACQUIRED BY AN INTERLEAVED SYSTEM OF DIGITIZERS WITH MISMATCHING FREQUENCY RESPONSE CHARACTERISTICS

BACKGROUND OF THE INVENTION

The present invention relates generally to the operation of measurement instruments. More specifically, the invention relates to measurement instruments consisting of analog-to-digital converters (ADCs) which are used to sample or digitize an analog signal, converting the analog signal to an array of values whose magnitude represents the voltage of the signal and the location in the array represents when the signal was sampled. Furthermore, the present invention relates to digitizing systems, which consist of multiple, interleaved ADCs.

Systems used to digitize analog signals utilize analog-to-digital converters that sample an analog signal at a time specified by a sample clock that is fed to the ADC. On prescribed rising and/or falling edges of this sample clock, the ADC samples the analog signal providing a digital value at its output. This digital value is typically stored in a memory of some sort for later use.

Waveform digitizing systems such as digital oscilloscopes are used by scientists and engineers to build ever faster electronic equipment. Because the speed of electronic equipment continues to increase, there is an ever-increasing demand for faster waveform digitizing systems. Recently, the speed demands placed on waveform digitizing systems have outpaced the physical capabilities of analog-to-digital converters. In other words, analog-to-digital converters which presently exist cannot sample signals fast enough to meet the demands of the electronics industry and the scientific community.

In order to overcome this physical limitation and make waveform-digitizing systems which sample signals at a higher rate, a technique called interleaving is used. Interleaving involves the usage of multiple ADCs in a waveform digitizing system. These ADCs are used in a manner in which all ADCs sample at the same rate, but they sample the signal at different times. For example, a waveform digitizing system utilizing two ADCs could sample a signal at an effective sample rate of 1 Gsample/second (1 Gs) if each ADC sampled the signal at 500 Ms, and each of these ADCs took every other sample of the signal. At the end of such a waveform acquisition, the resulting array of data points would contain data where half of the data was generated from one ADC and the other half from the other. More specifically, every other point in the resulting acquired signal would have been acquired by one of the ADCs while the remaining points were acquired by the other. This method of interleaving ADCs has been used with great success. Some digital sampling oscilloscopes utilize up to 16 interleaved ADCs in the acquisition of waveforms.

While bandwidth and sample rates of waveform digitizer systems are perhaps the most important qualities, accuracy of the system is almost equally important. In other words, the waveform digitizing system is expected to produce a digital representation of the sampled analog waveform with a high degree of accuracy. Said differently, the digitizing system is expected to faithfully reproduce an image of the analog signal being digitized. In systems utilizing a single ADC to digitize a waveform, the problem of faithful reproduction of the analog signal reduce to the solution of engineering problems in the design of the digitizer system involving front-end non-linearity and noise, ADC integral and differential non-linearity, sample clock accuracy and stability etc. In interleaved systems, these problems are exacerbated by the use of multiple digitizers.

First, the signal path to each digitizer must have identical characteristics. Any time delay, attenuation or gain applied differently in the path to each digitizer will result in noticeable degradation of the quality of the acquired signal. The same must be said for the sample clock delivery to the digitizers. Any variation in the timing from digitizer to digitizer will reduce the signal quality. Furthermore, each digitizer or ADC in an interleaved system will have characteristics that may vary from the other digitizers, the most important characteristic being frequency response. Differing frequency response manifests itself as a mismatching gain and time delay of the signal at various frequencies. Differences in frequency response are most likely at higher frequencies where different pole locations in the transfer function of the digitizers result in poor matching and therefore poor signal quality. As mentioned previously, high bandwidth is another feature desired of digitizing systems, and high bandwidth means that high frequency signals or signals with components at high frequencies are being digitized. This means that matching digitizer frequency response characteristics is a particular problem in high bandwidth systems that are used to digitize high frequency signals.

The current state of technology deals with these problems in several ways. In the design of a digital oscilloscope or other waveform digitizing system, good engineering practice is applied to ensure that the sample clock does not jitter and is delivered accurately to each digitizer. Furthermore, the paths to each digitizer are carefully designed and routed to provide as good signal path matching as practically possible. Finally, demands are placed on the designers of ADC chips to meet stringent frequency response specifications.

Additionally, ADCs are sometimes built with controls provided to precisely adjust the offset, gain, and sample clock delay to the ADC. Some systems dynamically measure and adjust the offset, gain and delay characteristics of the individual digitizers in the interleaved system using internal calibration signals and hardware controls. Even with the provision of these controls, it is still impossible to adjust for gain and delay characteristics of the digitizers that vary with frequency.

In summary, waveform-digitizing systems are incapable of meeting the increasing demands of the electronics industry using single digitizing elements. To address this, digitizing systems are sometimes designed utilizing multiple, interleaved digitizing elements which sample the same signal at different points in time. Interleaving creates problems in that mismatching digitizer characteristics degrade the quality of the digitized signal. Although many techniques are used to improve the signal quality, it is currently not possible to adjust the digitizers so that the frequency response between digitizers matches.

It would therefore be beneficial to provide an improved waveform digitizing system that overcomes these problems of the prior art.

OBJECTS OF THE INVENTION

It is therefore an object of the invention to provide an improved method and apparatus for digitizing high speed waveforms.

A further object of the invention is to provide an improved method and apparatus for digitizing high speed waveforms employing interleaved ADCs.

Another object of the invention is to provide an improved method and apparatus for digitizing high speed waveforms employing interleaved ADCs and compensating for differences in frequency response and other characteristics of the interleaved ADCs.

A still further object of the invention is to provide an improved method and apparatus for digitizing a high speed waveform employing a system of interleaved ADCs that provides complete recovery of the applied high speed waveform as if the system consisted of a plurality of interleaved digitizers with perfectly ideal frequency response characteristics.

Still other objects and advantages of the invention will in part be obvious and will in part be apparent from the specification and the drawings.

SUMMARY OF THE INVENTION

Generally speaking, the invention provides a method and apparatus for recovering a waveform whose acquisition and digitization has been contaminated by non-ideal digitizer frequency response characteristics. The present invention also deals with problems incurred by waveform acquisition systems utilizing multiple interleaved digitizers whose frequency response characteristics are non-ideal and mismatching.

FIG. 1 depicts such a digitizing apparatus, including a signal being applied to a waveform digitizing system employing multiple interleaved digitizing elements. This system generates an acquired signal, which is corrected in the waveform recovery system to generate a recovered signal. This invention focuses primarily on the functioning of the waveform recovery system.

FIG. 2 shows an example of a signal that might be applied to a digitizing system. It shows a single pulse from a train of pulses. This is an ideal signal in many ways in that it contains no noise. Moreover, it represents a good example signal because it represents a signal commonly digitized and a signal consisting of many frequency components. FIG. 3 shows what the acquired signal might look like when acquired by a system of interleaved digitizing elements, each having a different frequency response from the others. FIG. 4 shows the same acquired signal as in as well as showing which digitizer in the system acquired each point. This figure uses four individual digitizing elements as an example, with the understanding that the present method is applicable to any number of digitizers.

In summary, FIGS. 3 and 4 show an acquisition by a waveform digitizing system employing multiple interleaved digitizing elements, which does not represent a faithful reproduction of the signal applied in FIG. 2. It has been mathematically determined by the inventor that if the frequency response characteristics of each digitizer are known, then the actual signal that the digitizing system is attempting to sample may be recovered from the acquired data.

The present invention operates by first storing the measured frequency response characteristics for each digitizer. These characteristics can be measured at the factory or dynamically. They can he determined by the digitization of pure-sinusoidal signals at various frequencies whose amplitude and phase is known or by determining the step or impulse response from a step or pulse whose characteristics are well known. By examining the resulting magnitude and phase of the signal acquired by the digitizers at various frequencies, the frequency response of the digitizers can be measured. Once the frequency response of each digitizer is known an array of matrices are generated by the system. The generation of and principle behind these arrays are described subsequently, and comprise key elements of the invention. These generated arrays are then stored in memory. When a waveform is digitized, the acquired waveform is passed to a waveform recovery system, constructed in accordance with the invention, for processing. This system may be embodied in a digital signal processing system, a computer, or an embedded system considered as a back-end to the data acquisition system.

The system of the invention takes each digitized waveform, and calculates the Discrete Fourier Transform (DFT) of the waveform, thus determining the frequency components of the signal acquired. The frequency component values for the acquisition shown in FIG. 3 are shown in FIGS. 5 and 6 on the traces labeled acquired signal. These figures show the magnitude and phase values that make up a frequency component. From these components, an array of vectors is generated. This array of vectors has the same number of elements as the array of matrices previously stored as a result of the digitizer frequency response measurement. Additionally, each vector contains the same number of rows as the number of rows and columns in the matrices mentioned previously. Each vector is pre-multiplied by its corresponding matrix, thus generating an array of new vectors. These vectors are in turn used to generate a set of frequency components that represent those of the actual signal applied to the digitizer system. The invention generates the frequency component values shown in FIGS. 5 and 6 on the traces labeled applied signal. The inverse DFT is used to generate the recovered signal. The recovered signal is the signal which would have been acquired if the waveform digitizing system were made up of individual interleaved digitizers whose frequency response were unity at all frequencies.

The invention accordingly comprises the several steps and the relation of one or more of such steps with respect to each of the others, and the apparatus embodying features of construction, combination(s) of elements and arrangement of parts that are adapted to effect such steps, all as exemplified in the following detailed disclosure, and the scope of the invention will be indicated in the claims.

BRIEF DESCRIPTION OF THE DRAWINGS

For a more complete understanding of the invention, reference is made to the following description and accompanying drawings, in which.

DETAILED DESCRIPTION OF THE PREFERRED EMBODIMENTS

Theory of Operation

Figure 1:
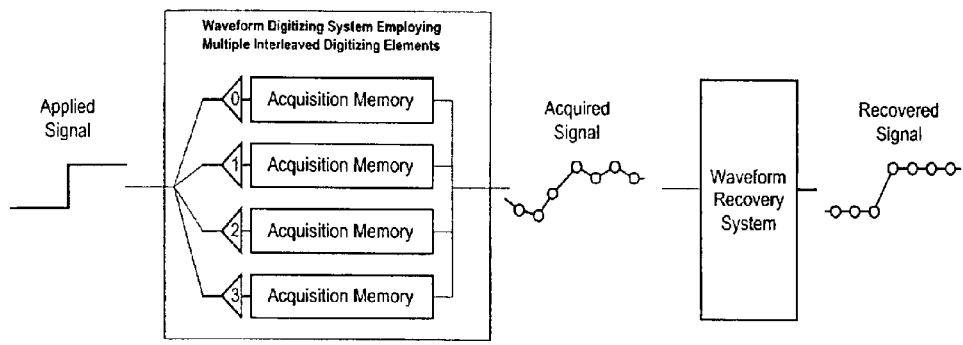
FIG. 1 is a system block diagram depicting the relationship of a waveform recovery system of the invention with the overall signal acquisition apparatus.

The theory behind the operation of the invention as determined by the inventor will now be explained.

Consider a sampled signal −x. A sampled signal is an array of points $x_k$ where k is the sample point number and represents the time that the sample was taken:

$$t_k := \frac{k}{F_s} \qquad \text{Equation 1}$$

Under ideal circumstances, this signal can be considered as exact sample points of an analog, continuous signal. The Discrete Fourier Transform (DFT) can be used to determine the frequency components of this signal:

$$X_n := \frac{1}{K} \cdot \sum_{k=0}^{K-1} x_k \cdot e^{-j\frac{2\pi n k}{K}} \qquad \text{Equation 2}$$

Where K is the number of points in the signal, and n is the frequency component bin. n=0 is 0 frequency and n=K is the sampling rate of the sampling system. A frequency component is a complex number representing the magnitude and phase of a sinusoid (usually a cosine) at that frequency specified by the frequency "bin" of the component of this signal. This document maintains the electrical engineering convention of expressing the imaginary number $\sqrt{-1}$ as j.

The actual frequency of the sinusoid calculated at a frequency bin n is:

$$f_n := \frac{n}{K} \cdot F_s \qquad \text{Equation 3}$$

Where f is the frequency of the component and $F_s$ is the effective sample rate of the system. Both values are in Hertz.

Knowing these frequency components (X), we could reconstruct the sampled signal using the inverse DFT:

$$x_k := \sum_{n=0}^{K-1} X_n \cdot e^{j\frac{2\pi n k}{K}} \qquad \text{Equation 4}$$

It is illustrative to substitute Equation 2 for X in Equation 4:

$$x_k := \sum_{n=0}^{K-1} \frac{1}{K} \cdot \sum_{\sigma=0}^{K-1} x_\sigma \cdot e^{-j\frac{2\pi n \sigma}{K}} \cdot e^{j\frac{2\pi n k}{K}} \qquad \text{Equation 5}$$

Equation 5 illustrates the fact that the inverse DFT of the DFT of a signal equals the signal itself. Stated differently, knowing the frequency components that make up a signal is equivalent to knowing the time-domain signal itself, since the time domain signal can be recovered from these frequency components. The present method works in the frequency domain with the understanding that the time-domain signal can always be generated from these components and that frequency components can always be generated from the time-domain signal.

Consider an interleaved acquisition system that acquires the signal represented by x. An interleaved system can be described by defining the following characteristics:

I The number of digitizers interleaved.
K The total number of points acquired by the interleaved system (with the understanding that this must be an integer multiple of I).

Note that K is also the last frequency bin of the DFT of the interleaved system (the index of the frequency bin representing the effective sample rate).

Throughout this derivation, the following range variables are assumed unless otherwise stated:

i:=0 . . . I−1 Used typically to index digitizers.
k:=0 . . . K−1 Used typically to index sample points in the interleaved acquisition.
n:=0 . . . K Used typically to index frequency bins in the frequency spectrum of the interleaved acquisition.

Normalized numbers are used to represent sample time and frequency. It is understood that values of n refer to frequencies as calculated in Equation 3 and that k refers to sample times as calculated in Equation 1. Knowing that the signal x is being acquired by an interleaved system with the above characteristics, Equation 2 can be rewritten as:

$$X_n := \frac{1}{K} \cdot \sum_{\sigma=0}^{\frac{K}{I}-1} \sum_{i=0}^{I-1} x_{\sigma \cdot I + i} \cdot e^{-j\frac{2\pi n (\sigma \cdot I + i)}{K}} \qquad \text{Equation 6}$$

If σ represents the sample number of a point acquired by a digitizer and i represents the digitizer number, then the data acquired by a single digitizer of the interleaved system can be written as:

$$\sigma := 0 \ldots \frac{K}{I} - 1 \qquad \text{Equation 7}$$

$$x_{d_i,\sigma} := x_{\sigma \cdot I + i}$$

and Equation 6 can be written as:

$$X_n := \frac{1}{K} \cdot \sum_{\sigma=0}^{\frac{K}{I}-1} \sum_{i=0}^{I-1} x_{d_i,\sigma} \cdot e^{-j\frac{2\pi n (\sigma \cdot I + i)}{K}} \qquad \text{Equation 8}$$

and further as:

$$X_n := \frac{1}{I} \cdot \sum_{i=0}^{I-1} e^{-j\frac{2\pi n i}{K}} \cdot \frac{1}{\frac{K}{I}} \cdot \sum_{\sigma=0}^{\frac{K}{I}-1} x_{d_i,\sigma} \cdot e^{-j\frac{2\pi n \sigma}{\frac{K}{I}}} \qquad \text{Equation 9}$$

The DFT of data acquired by an individual digitizer is defined as:

$$XD_{i,n} := \frac{1}{\frac{K}{I}} \cdot \sum_{\sigma=0}^{\frac{K}{I}-1} x_{d_i,\sigma} \cdot e^{-j\frac{2\pi n \sigma}{\frac{K}{I}}} \qquad \text{Equation 10}$$

Note the similarity of Equation 10 to Equation 2. Substituting Equation 10 into Equation 9:

$$X_n := \frac{1}{I} \cdot \sum_{i=0}^{I-1} e^{-j\frac{2\pi n i}{K}} \cdot XD_{i,n} \qquad \text{Equation 11}$$

Equation 11 states that the DFT of the interleaved acquisition can be determined from the DFTs of the data acquired by the individual digitizers.

An often poorly understood property of the DFT is that of decimation in time. Decimation in time effectively reduces the sample rate of the system. Reducing the sample rate correspondingly reduces the Nyquist rate, causing frequencies above the Nyquist rate to appear as aliases in the spectrum. The digitizers in an interleaved system are undersampling the acquisition (effectively sampling a time-decimated version of the signal) and frequencies above the Nyquist rate of the digitizers appear as aliases in the spectrum of the digitizers. This aliasing has no adverse effect on the interleaved acquisition.

Knowing the frequency components of the interleaved acquisition, the frequency components (DFT) of each digitizer can be written as follows:

$$XD_{i,n} := \sum_{\sigma=0}^{I-1} \text{conj}(X_{a(\sigma,n)}, \sigma) \cdot e^{(-1)^\sigma \cdot j \frac{2\pi \cdot a(\sigma,n) \cdot i}{K} \cdot \frac{i}{I}}$$ Equation 12

Where:

$$a(\sigma, n) := \text{floor}\left(\frac{\sigma+1}{2}\right) \cdot \frac{K}{I} + (-1)^\sigma \cdot \text{mod}\left(n, \frac{K}{I}\right)$$ Equation 13

And:

$$\text{conj}(X,\sigma) := Re(X) + j(-1)^\sigma \cdot Im(X)$$ Equation 14

Equation 12 effectively states that a frequency component in the DFT of the digitizer's spectrum is created by overlapping, or summing, components in the interleaved spectrum which alias at the same location. The components that are summed are delayed an amount corresponding to the digitizer's sampling location in the interleaved acquisition and the frequency of the overlapping component. Said slightly differently, the frequency components in the DFT of a single digitizer are a sum of aliased components in the spectrum of the interleaved acquisition.

Equation 13 states which frequency components overlap. For a system with I interleaved digitizers, I components in the frequency spectrum of the interleaved system will overlap to form a given frequency component in the digitizer DFT. Stated differently, a frequency component at bin n in the DFT of a single digitizer will be formed by overlapping components in the DFT of the interleaved acquisition at locations a(σ,n) where σ ranges from 0 to I−1. Furthermore, components due to an odd numbered Φ appear as the complex conjugate in the DFT of the digitizer spectrum.

This implies that the DFT of the interleaved acquisition can be written as:

$$X_n :=$$ Equation 15

$$\frac{1}{I} \cdot \sum_{i=0}^{I-1} e^{-j \frac{2\pi \cdot n \cdot i}{K} \cdot \frac{i}{I}} \cdot \sum_{\sigma=0}^{I-1} \text{conj}(X_{a(\sigma,n)}, \sigma) \cdot e^{(-1)^\sigma \cdot j \frac{2\pi \cdot a(\sigma,n) \cdot i}{K} \cdot \frac{i}{I}}$$

Equation 15 demonstrates a relationship between the frequency components of a signal, but cannot be used to directly calculate the DFT because it is a circular definition. Its validity is the basis for the present method of the invention. Basically, it states that a frequency component of a signal is a sum of the components of the individual digitizers and furthermore, the components seen by the individual digitizers are themselves the sum of overlapping, aliased frequency components of the signal.

The frequency response of each digitizer can be represented as:

$$R_{i,n} := g_{i,n} \cdot e^{j\, \Theta_{i,n}}$$ Equation 16

Where g is the magnitude response, Θ is the phase response, i is the digitizer number, and n is the frequency bin in the DFT of the interleaved acquisition. For real systems, the frequency response will have the following characteristics:

$$f := 1 \ldots \frac{K}{2}$$ Equation 17

$$R_{i, \frac{K}{2}+f} := \overline{R_{i, \frac{K}{2}-f}}$$

$$\theta_{i,0} := 0 \quad \theta_{i,K} := 0 \quad \theta_{i,\frac{K}{2}} := 0$$

Equation 17 states that the gain response is folded about the Nyquist rate of the digitizer, and that the phase response is folded as well, but appears as the complex conjugate. Said differently, the gain response is even and the phase response is odd.

Also, the phase response for each digitizer is zero for a DC signal component, as well as a component at the sampling rate of the digitizer. The phase response is also zero at the Nyquist rate, where phase and gain are indistinguishable. A frequency component at the Nyquist rate appears as an alternating sequence of positive and negative numbers of the same magnitude. Depending on whether the signal starts on a positive or negative number, the signal can be thought to have a magnitude of plus or minus that number, but the phase is always zero.

Using the relationship shown in Equation 15, one can define the frequency components in an acquisition:

$$X_{acq} := \frac{1}{I} \cdot \sum_{i=0}^{I-1} e^{-j \frac{2\pi \cdot n \cdot i}{K} \cdot \frac{i}{I}} \cdot$$ Equation 18

$$\sum_{\sigma=0}^{I-1} \text{conj}(X_{a(\sigma,n)} \cdot R_{i,a(\sigma,n)}, \sigma) \cdot e^{(-1)^\sigma \cdot j \frac{2\pi \cdot a(\sigma,n) \cdot i}{K} \cdot \frac{i}{I}}$$

Equation 18 is identical to Equation 15, except that the frequency components defined by the equation are now defined as the frequency components in the interleaved acquisition. The frequency components of the acquisition now differ from those of the actual applied signal because of the non-ideal digitizer frequency response characteristics. Each frequency component in the actual applied signal is multiplied by the frequency response of the digitizer acquiring that component. Note that all digitizers see all frequency components of the applied signal.

By examining Equation 18, a problem becomes apparent in the usage of multiple digitizers generating interleaved acquisitions. First, R will typically be different from unity, meaning that the signal acquired will not be the same as the actual signal applied. More significant, however is the fact that the frequency response from digitizer to digitizer may not match. If R matched from digitizer to digitizer (i.e. R can be defined as $R_{i,n} := \rho_n$), then the equation defining the frequency components acquired would be simply:

$$X_{acq_n} := \rho_n \cdot X_n$$ Equation 19

The recovery of the actual applied signal could then be possible using the following simple equation:

$$X_n := \frac{1}{\rho_n} \cdot X_{acq_n} \quad \text{Equation 20}$$

Dealing with matching frequency response characteristics for each digitizer is a trivial matter. A more interesting problem arises when the frequency response for each digitizer does not match. In this case, the problem becomes the solution of Equation 18 for all X.

To examine the possibilities for solving Equation 18, it is manipulated as follows:

$$X_{acq_n} := \frac{1}{I} \cdot \sum_{i=0}^{I-1} e^{-j\frac{2\pi \cdot n \cdot i}{K} \cdot \frac{I}{T}} \cdot$$

$$\sum_{\sigma=0}^{I-1} \text{conj}(X_{a(\sigma,n)}, \sigma) \text{conj}(R_{i,n(\sigma,n)}, \sigma) \cdot e^{(-1)^{\sigma} j \frac{2\pi \cdot a(\sigma,n) \cdot i}{K} \cdot \frac{i}{T}} \quad \text{Equation 21}$$

and further as:

$$x_{acq_a} := \sum_{\sigma=0}^{I-1} \text{conj}(X_{a(\sigma,n)}, \sigma) \cdot \frac{1}{I} \cdot \quad \text{Equation 22}$$

$$\sum_{i=0}^{I-1} \text{conj}(R_{i,a(\sigma,n)}, \sigma) e^{(-1)^{e} j \frac{2\pi(\sigma,n) \cdot i}{K} \cdot \frac{i}{T}} \cdot e^{-j\frac{2\pi \cdot \sigma \cdot i}{K} \cdot \frac{i}{T}}$$

Equation 22 demonstrates that a particular frequency component in the acquired signal is a function of I frequency components in the spectrum of the applied signal. Furthermore, it is a sum of products of these I components and coefficients which are calculated as a function of the digitizer frequency responses.

It is possible to find I frequency components in the acquisition which are sums of products of the same I components in the applied signal and coefficients. To illustrate this fact, Equation 22 is written as:

$$\sigma := 0 \ldots I-1 \quad c := 0 \ldots \frac{K}{I \cdot 2} \quad \varepsilon := 0 \ldots I-1$$

$$x_{acq_{a(c,t)}} := \sum_{e=0}^{I-1} \text{conj}(x_{a(a,c)}, \varepsilon + \sigma) \cdot \quad \text{Equation 23}$$

$$\frac{1}{I} \cdot \sum_{i=0}^{I-1} \cdot e^{(-1)^{\varepsilon + e} j \frac{2\pi \cdot (\sigma,n) \cdot i}{K} \cdot \frac{i}{T}} \cdot e^{-j\frac{2\pi \cdot \sigma \cdot i}{K} \cdot \frac{i}{T}}$$

Equation 23 represents κ/2·I+1 sets of I linear, independent equations with I unknowns. It can therefore be written in matrix form by defining the following matrices and vectors:

$$(A_c)_{c,\sigma} \leftarrow \text{conj}\left[\frac{1}{I} \cdot (\text{conj}(R_{1,a(\sigma,e)}, \varepsilon + \sigma)) \cdot \right. \quad \text{Equation 24}$$

$$\left. e^{(-2)^{\varepsilon + e} j \frac{2\pi \cdot (\sigma,n) \cdot i}{K} \cdot \frac{i}{T}} \cdot e^{-j\frac{2\pi \cdot \sigma \cdot i}{K} \cdot \frac{i}{T}}, a\right]$$

$$(B_c)_\sigma \leftarrow \text{conj}(X_{a(\sigma,c)}, \sigma) \quad \text{Equation 25}$$

$$(C_c)_\sigma \leftarrow \text{conj}(X_{acq_{a(\sigma,c)}}, \sigma) \quad \text{Equation 26}$$

Which allows us to write Equation 23 in the following simple form:

$$X_{aca_{a(e,c)}} := \text{conj}[(A_c \cdot B_c)_e, \varepsilon] \quad \text{Equation 27}$$

Solving Equation 27 yields:

$$X_{calc_{a(e,c)}} := \text{conj}[[(A_c)^{-1} \cdot C_c]_e, \varepsilon] \quad \text{Equation 28}$$

Equation 28 yields the frequency components of the applied signal from 0 to the Nyquist rate.

The components above Nyquist can be filled in using the following formula.

$$f := 1 \ldots \frac{K}{2}$$

$$x_{calc_{\frac{K}{2}+f}} := \overline{x_{calc_{\frac{K}{2}-f}}} \quad \text{Equation 29}$$

The applied signal is fully recovered by applying the inverse DFT:

$$x_{calc_k} := \sum_{n=0}^{K-1} X_{calc_n} \cdot e^{j\frac{2\pi \cdot n \cdot k}{K}} \quad \text{Equation 30}$$

where $x_{calc}$ is identical to x—the applied signal.

The present method involves the provision of an apparatus and method, which applies the theory behind recovering the actual applied signal from the signal acquired by multiple interleaved digitizers with mismatching frequency response characteristics.

Figure 2:
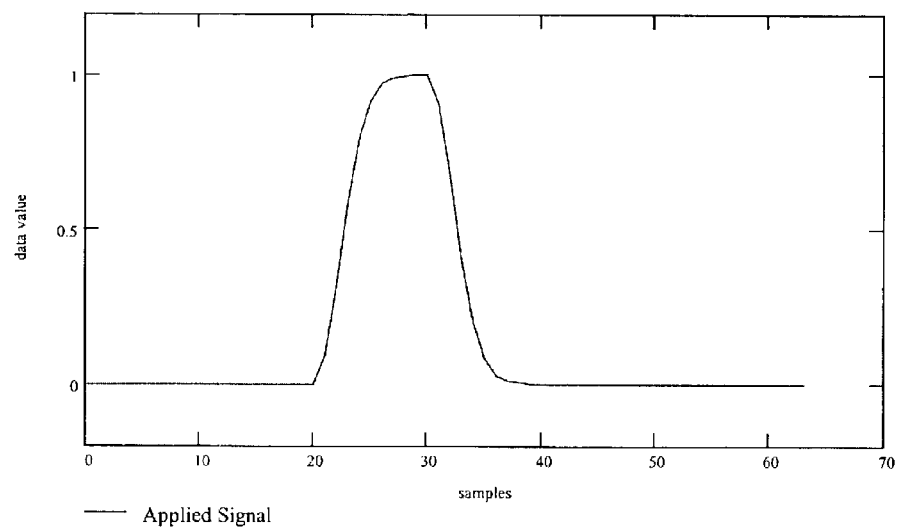
FIG. 2 depicts the applied signal of FIG. 1.
Figure 3:
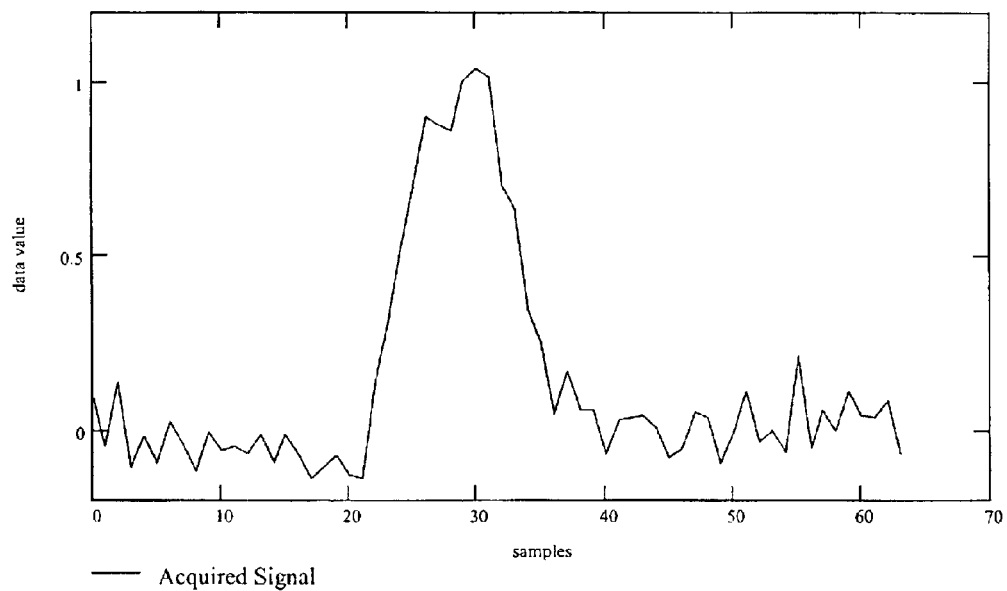
FIG. 3 depicts the acquired signal of FIG. 1.
Figure 4:
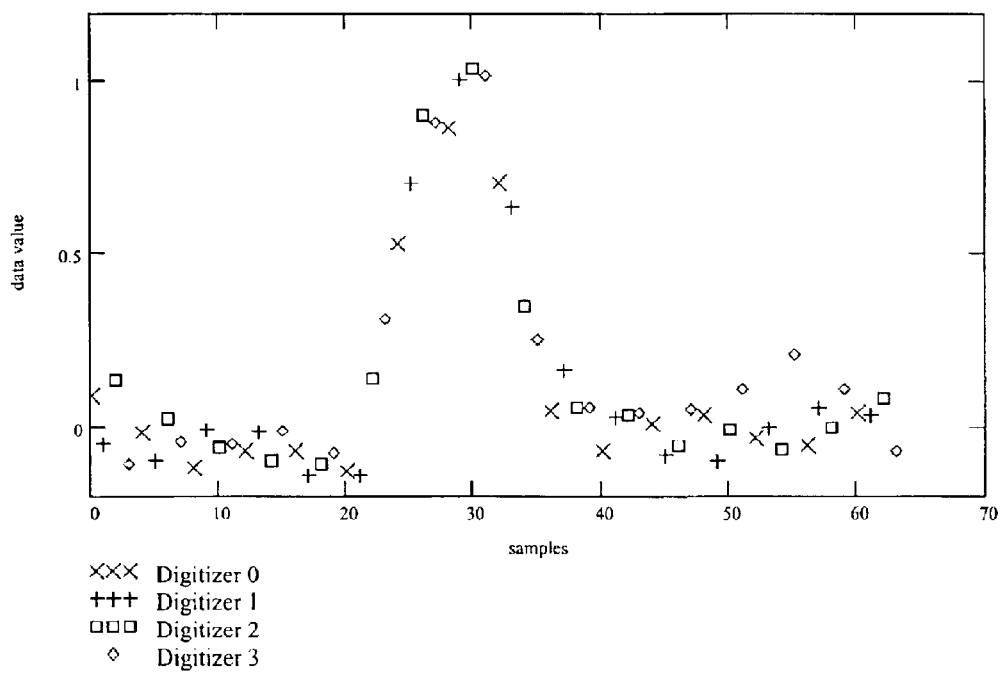
FIG. 4 depicts samples acquired by each digitizing element of FIG. 1.
Figure 5:
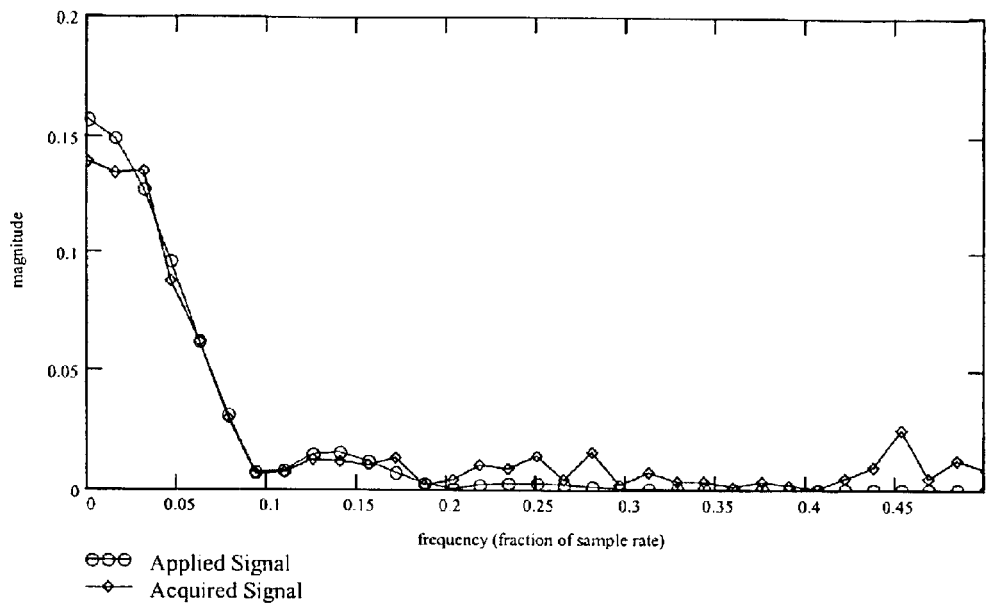
FIG. 5 depicts a comparison of the magnitudes of the applied and acquired signals.
Figure 6:
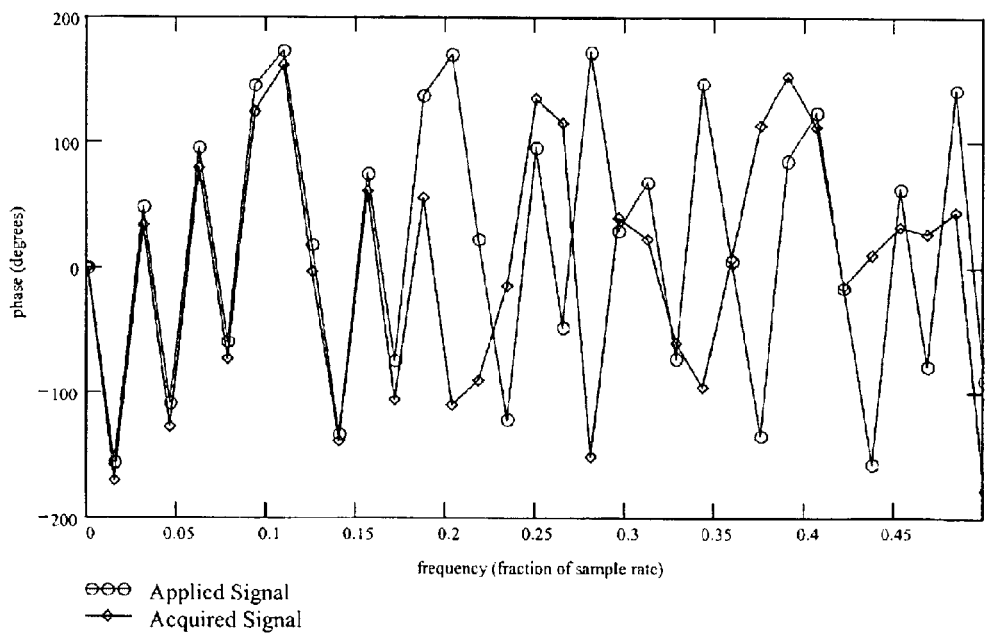
FIG. 6 depicts a comparison of the phases of the applied and acquired signals.

FIG. 1 shows a basic block diagram of such an apparatus. It shows a waveform digitizing system consisting of multiple, interleaved digitizing elements. With an applied signal, as in FIG. 2, a resulting acquisition might look like that shown in FIG. 3. After such a waveform digitization, the waveform resides in the acquisition memory of the digitizing system. FIG. 1 shows the acquisition residing in a separate acquisition memory for each individual digitizer, which is usually but not necessarily the case.

The main subject of the present invention is the waveform recovery system block shown in FIG. 1. While the waveform recovery system can conceptually be regarded as part of the waveform acquisition system (since it contributes to the acquisition of waveforms, which represent the applied waveform) for the purpose of this description, it shall be considered as a separate, back-end unit.

Figure 7:
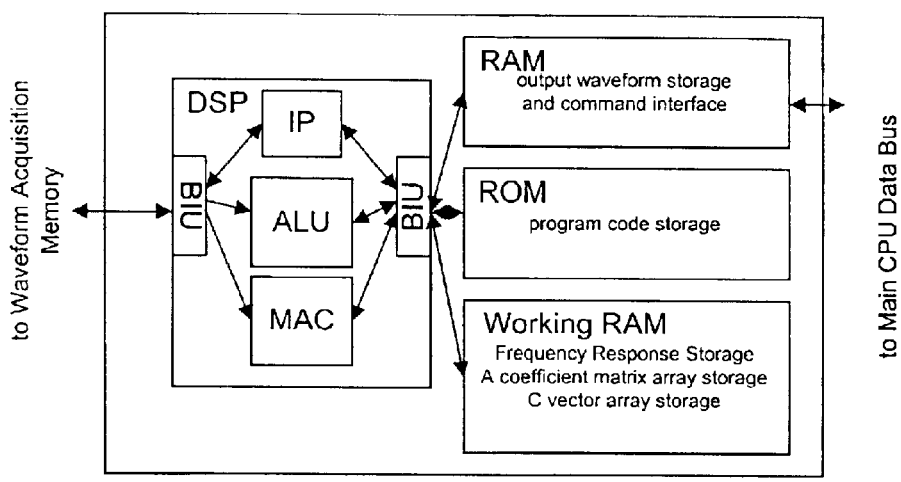
FIG. 7 is a block diagram depicting the structure of the Waveform Recovery System of FIG. 1.

This waveform recovery block in FIG. 1 is shown in detail in FIG. 7. The system in this diagram consists of a digital signal processor (DSP) 710 RAM, ROM, and working RAM memory 720, 730 and 740, respectively, and associated interfacing hardware required to interface to both the systems acquiring the signal, and the recipient of the acquired signal. In general, this system is located logically between the waveform digitizing system and the user of the digitized data, most generally, another processing element such as the main processor controlling a digital sampling oscilloscope. The digital signal processor consists, most notably, of an instruction processor (IP) 711, bus interface units (BIUs) 712, an arithmetic-logic unit (ALU) 713, and a multiplier-accumulator (MAC) unit 714. Many such processors benefit from a pipelined architecture and may contain many such units.

Processor 710 interfaces to read-only memory (ROM) 730 containing the instructions necessary to execute the present method. Furthermore, it interfaces to random-access memory (RAM) 740 which provides storage of the data generated prior to and during waveform recovery. Finally, it interfaces to another RAM element 720 that contains the recovered waveforms. This RAM 720 is accessible both by DSP 710 and by an external device. The arbitration of RAM 720 may be performed utilizing arbitration hardware, direct memory access (DMA) controllers, or through the use of dual-ported RAM. Either way, the system accepts commands and provides recovered waveforms through this interface.

The signal recovery is accomplished by executing specific steps determined by the program code. The two most general description of the major steps include:

1. Determine the frequency response characteristics of each digitizer and calculate and invert the A coefficient matrices as defined in Equation 24.
2. Acquire and recover the applied signals.

The determination of the frequency response characteristics of the digitizers can be performed once at the factory or dynamically if the frequency response characteristics change with temperature or time. Immediately following the digitizer characterization, the A coefficient matrix can be calculated and pre-inverted. This is possible because this matrix depends only on the characteristics of the digitizers and the interleaved system as a whole and does not depend on the applied signal in any way. If possible, the A coefficient matrices can be stored in ROM. Alternatively, the frequency response matrices can be stored in ROM and the A coefficient matrices can be generated by the system at run-time, during the initialization phase. Otherwise, the frequency response matrices can be downloaded to the system by a main processor dynamically.

Figure 8:
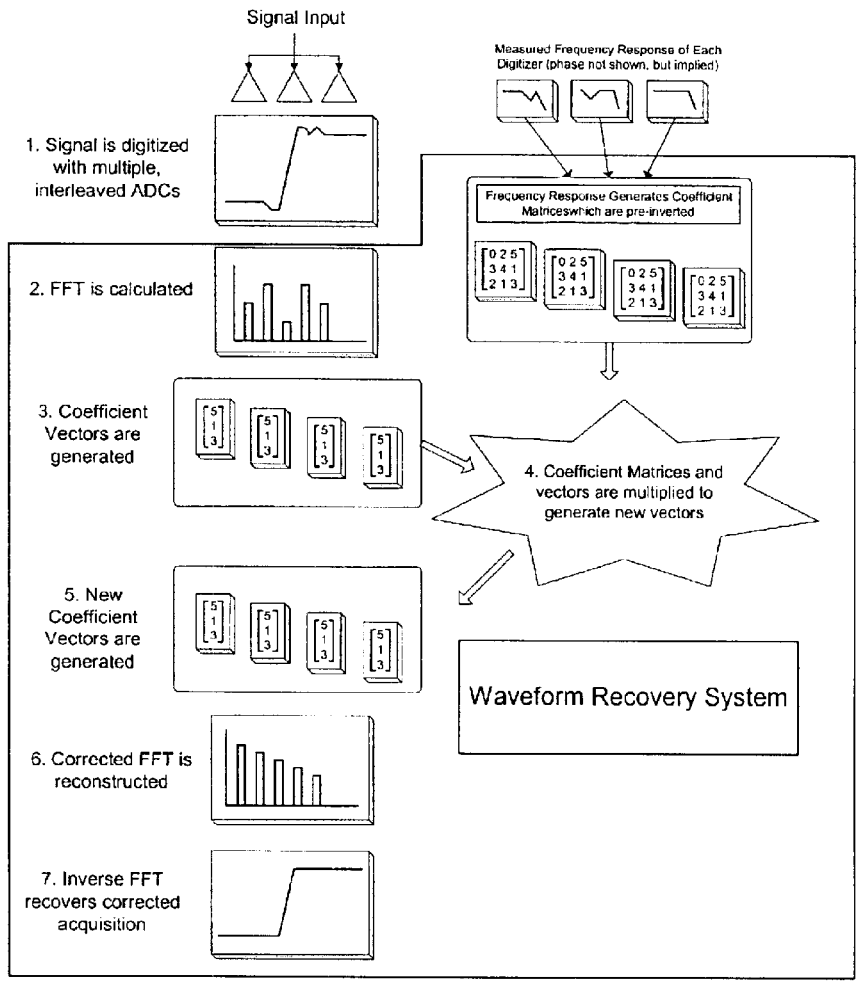
FIG. 8 is a flowchart depicting the method of recovering an applied waveform in accordance with the invention.

Once the A coefficient matrices exist, signals can be acquired and recovered endlessly using these predetermined coefficient matrices. The steps that the waveform recovery system must perform are shown in FIG. 8 and will be described subsequently in detail. Once the frequency response of each digitizer has been determined as in Equation 17, the following program is used to generate the pre-inverted A coefficient matrices as outlined in Equation 24:

$$a(\sigma, n, K, I) := \text{floor}\left(\frac{\sigma+1}{2}\right) \cdot \frac{K}{I} + (-1)^\sigma \cdot \text{mod}\left(n, \frac{K}{I}\right) \quad \text{Equation 31}$$

$$\text{conj}(X, \sigma) := \text{Re}(X) + j \cdot (-1)^\sigma \cdot \text{Im}(X) \quad \text{Equation 32}$$

$$Ainv\_calc(R, K, I) := \ldots$$

$$\left|\begin{array}{l} \text{for } c \in 0 \cdot \frac{K}{1 \cdot 2} \\ \left|\begin{array}{l} \text{for } c \in 0 \ldots I-1 \\ \left|\begin{array}{l} \text{for } \sigma \in 0 \ldots I-1 \\ Ai_{c,\sigma} \leftarrow \text{conj}\left[\frac{1}{I} \cdot \sum_{i=0}^{I-1} (\text{conj}(R_{i,a(\sigma,c,K,I)}, c+\varepsilon)) \cdot e^{(-1)^{c+\sigma} \cdot ij \frac{2\pi \cdot n(e,c,K,1)\frac{1}{I}}{K}} \cdot e^{-ij \frac{2\pi \cdot n(e,c,K,1)\frac{1}{I}}{K}}, \varepsilon\right] \\ A_c \leftarrow Ai^{-1} \end{array}\right. \end{array}\right. \\ A \end{array}\right.$$

Once Equation 33 has been used to generate the array of pre-inverted A coefficient matrices, signals can be acquired and the applied signal can be recovered using the following program:

$$C\_calc(X_{acq}, K, I) := \left|\begin{array}{l} \text{for } c \in 0 \ldots \frac{K}{2 \cdot I} \\ \left|\begin{array}{l} \text{for } \sigma \in 0 \ldots I-1 \\ Ci_\sigma \leftarrow \text{conj}(X_{acq_{a(\sigma,c,K,I)}}, \sigma) \end{array}\right. \\ C_c \leftarrow Ci \\ C \end{array}\right. \quad \text{Equation 34}$$

$$\text{recover}(x_{acq}, A, K, I) := \left|\begin{array}{l} \text{for } n \in 0 \ldots K \\ X_{acq_n} \leftarrow \frac{1}{K} \cdot \sum_{k=0}^{K-1} x_{acq_k} \cdot e^{-j\frac{2\pi \cdot n \cdot k}{K}} \\ C \leftarrow C\_calc(X_{acq}, K, I) \\ \text{for } c \in 0 \ldots \frac{K}{2 \cdot I} \\ B_c \leftarrow A_c \cdot C_c \\ \text{for } c \in 0 \ldots \frac{K}{2 \cdot I} \\ \quad \text{for } \varepsilon \in 0 \ldots I-1 \\ \quad X_{calc_{b(e,c,k,l)}} \leftarrow \text{conj}[(B_c)_c, \varepsilon] \\ \text{for } f \in 1 \ldots \frac{K}{2} \\ X_{calc_{\frac{K}{2}+f}} \leftarrow \overline{X_{calc_{\frac{K}{2}-f}}} \\ \text{for } k \in 0 \ldots K-1 \\ X_{calc_k} \leftarrow \text{Re}\left(\sum_{n=0}^{K-1} X_{calc_\sigma} e^{j\frac{2\pi \cdot n \cdot k}{K}}\right) \\ x_{calc} \end{array}\right. \quad \text{Equation 35}$$

Equation 33 and Equation 35 are used as follows to recover the applied signal from an acquisition:

$$Ainv := Ainv\_calc(R, K, I) \quad \text{Equation 36}$$

$$X_{calc} := \text{recover}(x_{acq}, Ainv, K, I) \quad \text{Equation 37}$$

In Equation 36, R is an I by K+1 matrix. The matrix contains I rows representing the digitizer number and K+1 columns representing the frequency bin in the DFT of the digitizer spectrum, such that an element $R_{i,n}$ represents the frequency response of digitizer i to an input frequency of n (see Equation 3). Again, K represents the total number of points acquired by the interleaved system and I represents the number of interleaved digitizers.

Equation 33

The output of Ainv_calc( ) is an array of $\kappa/2 \cdot I+1$ elements whereby each element is an I by I matrix. Each matrix is a pre-inverted A coefficient matrix for a given group of I frequencies.

In Equation 37, $x_{acq}$ is the signal acquired by the interleaved system. It contains K points. When this vector is passed to Equation 35, along with Ainv, the acquisition is corrected and the actual applied signal is recovered. The recovered signal also has K points.

The steps of the recover ( ) function are shown in FIG. 8.

Step 1. An input signal is first digitized utilizing multiple interleaved ADCs.

Step 2. The DFT is then taken of the acquired signal to generate the frequency components of the acquisition. This is generally performed using the fast Fourier transform (FFT), but the simple DFT is shown here for clarity.

Step 3. The C array of coefficient vectors is generated. C is an array of $\kappa/2 \cdot I+1$ elements where each element is an I by 1 (one) element vector.

Step 4. The B array is generated by multiplying each I by I element matrix in A by each I by 1 (one) element vector in C. This step is performed utilizing pre-inverted coefficient matrices, as noted above.

Step 5. New coefficient vectors are formed as the result of the step 4.

Step 6. The DFT of the recovered signal is generated from the elements in the B array, filling in the components above the Nyquist rate of the interleaved acquisition making the phase odd and the magnitude even.

Step 7. The signal is completely recovered by taking the inverse DFT. Again, this would normally be performed using an inverse FFT algorithm, but is shown here as the simple IDFT for clarity.

Once the applied signal is recovered, it is passed to some client who is making use of the waveform, such as the main processor of a digital sampling oscilloscope. In FIG. 7, this is shown as the data bus of the main central processing unit (CPU) of a system, but the data could be sent in any manner to any other system, not excluding DMA transfer, serial or parallel link, or network connection.

Practical Considerations

Systems utilizing a digital-processing element, such as a digital signal processor, or the like have specific design requirements. Of these requirements, the two most relevant to the present invention include processing power and memory storage requirements. Processing power is the ability of a processor to perform operations and is generally stated in MIPS (millions of instructions per second) or MFLOPS (millions of floating point operations per second). Since the present method is generally utilized in a system performing waveform digitizing operations as quickly as possible, it is important to understand the number of operations required per waveform digitizing operation to recover each signal.

The recovery of the signal consists basically of a DFT and IDFT calculation, along with matrix multiplication in between. The matrix multiplication results in the following number of complex arithmetic operations per recovery:

| | |
|---|---|
| Complex multiplications required | $\left(\frac{K}{2 \cdot I} + 1\right) \cdot I^2$ |
| Complex additions required | $\left(\frac{K}{2 \cdot I} + 1\right) \cdot I \cdot (I-1)$ |

Complex multiplications require four actual multiplications and two actual additions. Complex additions require two actual additions, so the actual processing burden becomes:

| | |
|---|---|
| Multiplications required | $\left(\frac{K}{2 \cdot I} + 1\right) \cdot I^2 \cdot 4$ |
| Additions required | $\left(\frac{K}{2 \cdot I} + 1\right) \cdot [I \cdot (I-1) \cdot 2 + I^2 \cdot 2]$ |
| Total arithmetic operations required | $\left(\frac{K}{2 \cdot I} + 1\right) \cdot [I \cdot (I-1) \cdot 2 + I^2 \cdot 2 + I^2 \cdot 4]$ <br> or simply: <br> $4 \cdot K \cdot I - K + 8 \cdot I^2 - 2 \cdot I$ |

The rate at which this invention is capable of recovering waveforms depends on the processor used, the number of interleaved digitizers employed and size of the acquired waveforms. The rate of recovery is equal to the processing power of the processor (in operations per second) divided by the total number of operations required as calculated above. This rate is reduced depending on other housekeeping operations performed by the processor, along with any overhead accessing the acquired waveform.

It is also important to understand the storage requirements for the system. These include:

| | |
|---|---|
| A coefficient matrices | $\left(\frac{K}{2 \cdot I} + 1\right) \cdot I^2$ <br> complex numbers <br> or $\left(\frac{K}{2 \cdot I} + 1\right) \cdot I^2 \cdot 2$ <br> numbers |
| C vectors | $\left(\frac{K}{2 \cdot I} + 1\right) \cdot I$ complex numbers or <br> $\left(\frac{K}{2 \cdot I} + 1\right) \cdot I \cdot 2$ <br> numbers |
| Waveform DFT | K complex numbers or <br> $2 \cdot k$ numbers |
| Recovered Signal | K numbers |
| Total Storage Requirements | $\left(\frac{K}{2 \cdot I} + 1\right) \cdot I^2 \cdot 2 + \left[\left(\frac{K}{2 \cdot I} + 1\right) \cdot I \cdot 2\right] + 2 \cdot K + K$ <br> or simply <br> $K \cdot 1 + 2 \cdot 1^2 + 4 \cdot K + 2 \cdot 1$ <br> numbers this is approximately |

K · (4 + 1) for systems whose acquisition size is much larger than the number of interleaved digitizers Other important considerations involve limitations of the digitizing system itself, which tends to constrain the ability of the present method to completely recover the applied signal. In general, digitizing systems add noise and are non-ideal in other respects not related to digitizer frequency response characteristics. All digitizing systems add, if anything, quantization noise. Because of quantization, the signal to noise ratio becomes smaller as the amplitude of the signal decreases with respect to the voltage range over which the digitizers operate. This means that at locations in the digitizer frequency response characteristics where frequency components of the applied signal are greatly attenuated (at higher frequencies, for example, near the bandwidth limitations of the system), attempting to recover these frequency components will result in noise amplification.

In order to avoid this, the signal is generally recovered and then rolled off smoothly to avoid noise amplification. Rolling off the signal is as simple as point by point multiplication of each frequency component recovered by the desired gain and phase response prior to application of the inverse DFT to recover the applied signal. This filtering method of the DFT is well known to those skilled in the art of signal processing.

Another consideration is aliasing. The present method demonstrates that aliasing in the spectrum of the individual digitizers which are under-sampling the signal poses no problem in the recovery of the actual applied signal. Frequency components above the Nyquist rate of the interleaved system (above half the effective sample rate) will present problems, however. All frequency components of the applied signal must be below the Nyquist rate of the interleaved system. In other words, the total system must be effectively oversampling.

One final consideration involves a property of the DFT. As is well known, the DFT assumes repetitive waveforms. In other words, the frequency components calculated from the DFT are generated assuming that the time-domain signal acquired repeats over and over. Discontinuities between the end and the beginning of the acquired signal lead to leakage or spreading of the spectral values. If leakage presents a problem, windowing of the acquired signal may be used, but this will involve discarding data points at the edges of the recovered signal.

It will thus be seen that the objects set forth above, among those made apparent from the preceding description, are efficiently attained and, because certain changes may be made in carrying out the above method and in the construction(s) set forth without departing from the spirit and scope of the invention, it is intended that all matter contained in the above description and shown in the accompanying drawings shall be interpreted as illustrative and not in a limiting sense.

It is also to be understood that the following claim are intended to cover all of the generic and specific features of the invention herein described an all statements of the scope of the invention which, as a matter of language, might be said to fall therebetween.

What is claimed is:

1. A method for generating a waveform recover system for recovering a signal acquired by an interleaved system of a plurality of digitizers, comprising the steps of:
   determining a set of frequency response characteristics of each of said plurality of digitizers;
   calculating a coefficient matrix for each of said set of frequency response characteristics; and
   storing said coefficient matrices in memory.

2. The method of claim 1, wherein each of said coefficient matricies defines a correction to be applied to the portion of a waveform acquired by an associated digitizer.

3. The method of claim 2, wherein each of said coefficient matricies defines a correction to be applied based upon a frequency of said acquired signal.

4. A method for recovering an applied signal acquired by an interleaved system of a plurality of digitizers, comprising the steps of:
   determining a set of frequency response characteristics of each of said plurality of interleaved digitizers;
   calculating a coefficient matrix for each said set of frequency response characteristics, each said coefficient matrix defining a correction to be applied to a portion of said acquired signal acquired by an associated digitizer based upon a frequency of said acquired signal;
   applying an appropriate coefficient matrix to said portion of said signal acquired by an associated digitizer to correct said signal portion; and
   reconstructing said applied signal by confining all of said corrected signal portions.

5. A method for recovering an applied signal acquired by an interleaved system of a plurality of digitizers, comprising the steps of:
   acquiring a portion of said applied signal by each of said plurality of digitizers;
   applying a correction to each of said acquired portions of said applied signal, said correction being determined based upon the frequency of said acquired portion of said applied signal in accordance with a coefficient matrix calculated for each of said plurality of digitizers, each of said coefficient matricies being defined according to measured frequency response characteristics of an associated digitizer; and
   reconstructing an output signal by combining corrected acquired signals from each of said digitizers.

6. An apparatus for generating a waveform recover system for recovering a signal acquired by an interleaved system of a plurality of digitizers, comprising:
   means for determining a set of frequency response characteristics of each of said plurality of digitizers;
   means for calculating a coefficient matrix for each of said set of frequency response characteristics; and
   means for storing said coefficient matricies.

7. The apparatus of claim 6, wherein each of said coefficient matricies defines a correction to be applied to the portion of a waveform acquired by an associated digitizer.

8. The apparatus of claim 7, wherein each of said coefficient matricies defines a correction to be applied based upon a frequency of said acquired signal.

9. An apparatus for recovering an applied signal acquired by an interleaved system of a plurality of digitizers, comprising:
   means for determining a set of frequency response characteristics of each of said plurality of interleaved digitizers;

means for calculating a coefficient matrix for each said set of frequency response characteristics, each said coefficient matrix defining a correction to be applied to a portion of said acquired signal acquired by an associated digitizer based upon a frequency of said acquired signal;

means for applying an appropriate coefficient matrix to said portion of said signal acquired by an associated digitizer to correct said signal portion; and means for reconstructing said applied signal by confining all of said corrected signal portions.

10. An apparatus for recovering an applied signal acquired by an interleaved system of a plurality of digitizers, comprising:

means for acquiring a portion of said applied signal by each of said plurality of digitizers;

means for applying a correction to each of said acquired portions of said applied signal, said correction being determined based upon the frequency of said acquired portion of said applied signal in accordance with a coefficient matrix calculated for each of said plurality of digitizers, each of said coefficient matricies being defined according to measured frequency response characteristics of an associated digitizer; and means for reconstructing an output signal by combining corrected acquired signals from each of said digitizers.

11. A computer program for recovering a signal acquired by an interleaved system of a plurality of digitizers, comprising instructions for:

determining a set of frequency response characteristics of each of said plurality of digitizers;

calculating a coefficient matrix for each of said set of frequency response characteristics; and storing said coefficient matricies in memory.

12. The computer program of claim 11, wherein each of said coefficient matricies defines a correction to be applied to the portion of a waveform acquired by an associated digitizer.

13. The computer program of claim 12, wherein each of said coefficient matricies defines a correction to be applied based upon a frequency of said acquired signal.

14. A computer program for recovering an applied signal acquired by an interleaved system of a plurality of digitizers, comprising instructions for:

determining a set of frequency response characteristics of each of said plurality of interleaved digitizers;

calculating a coefficient matrix for each said set of frequency response characteristics, each said coefficient matrix defining a correction to be applied to a portion of said acquired signal acquired by an associated digitizer based upon a frequency of said acquired signal;

applying an appropriate coefficient matrix to said portion of said signal acquired by an associated digitizer to correct said signal portion; and reconstructing said applied signal by confining all of said corrected signal portions.

15. A computer program for recovering an applied signal acquired by an interleaved system of a plurality of digitizers, comprising instructions for:

acquiring a portion of said applied signal by each of said plurality of digitizers;

applying a correction to each of said acquired portions of said applied signal, said correction being determined based upon the frequency of said acquired portion of said applied signal in accordance with a coefficient matrix calculated for each of said plurality of digitizers, each of said coefficient matricies being defined according to measured frequency response characteristics of an associated digitizer; and reconstructing an output signal by combining corrected acquired signals from each of said digitizers.

16. A method for recovering an applied signal acquired by an interleaved system of a plurality of digitizers, comprising the steps of:

determining a set of frequency response characteristics of each of said plurality of digitizers; and applying a function to the portion of said signal acquired by each of said plurality of digitizers, said function applied to the portion of said signal acquired by any one of said plurality of digitizers being defined according to the set of determined frequency response characteristics of said one of said plurality of digitizers.

17. The method of claim 16, wherein said function applied to each of said plurality of digitizers normalizes differences between the frequency response characteristics of each of said plurality of digitizers.

18. The method of claim 16, wherein said function associated with each of said plurality of digitizers is predetermined.

19. Apparatus for recovering an applied signal acquired by an interleaved system of a plurality of digitizers, comprising:

means for determining a set of frequency response characteristics of each of said plurality of digitizers; and means for applying a function to the portion of said signal acquired by each of said plurality of digitizers, said function applied to the portion of said signal acquired by any one of said plurality of digitizers being defined according to the set of determined frequency response characteristics of said one of said plurality of digitizers.

20. The apparatus of claim 19, wherein said function applied to each of said plurality of digitizers normalizes differences between the frequency response characteristics of each of said plurality of digitizers.

21. The apparatus of claim 19, wherein said function associated with each of said plurality of digitizers is predetermined.

22. A computer program for recovering an applied signal acquired by an interleaved system of a plurality of digitizers, said computer program comprising instructions for:

determining a set of frequency response characteristics of each of said plurality of digitizers; and applying a function to the portion of said signal acquired by each of said plurality of digitizers, said function applied to the portion of said signal acquired by any one of said plurality of digitizers being defined according to the set of determined frequency response characteristics of said one of said plurality of digitizers.

23. The computer program of claim 22, wherein said function applied to each of said plurality of digitizers normalizes differences between the frequency response characteristics of each of said plurality of digitizers.

24. The computer program of claim 22, wherein said function associated with each of said plurality of digitizers is predetermined.

* * * * *